United States Patent [19]

Beasom et al.

[11] Patent Number: 5,962,908
[45] Date of Patent: Oct. 5, 1999

[54] CONTACT REGIONS FOR NARROW TRENCHES IN SEMICONDUCTOR DEVICES AND METHOD

[75] Inventors: James D. Beasom, Melbourne Village; Dustin A. Woodbury, Indian Harbor Beach, both of Fla.

[73] Assignee: Harris Corporation, Melbourne, Fla.

[21] Appl. No.: 08/845,214

[22] Filed: Apr. 21, 1997

Related U.S. Application Data

[62] Division of application No. 08/279,027, Jul. 22, 1994, Pat. No. 5,622,890.

[51] Int. Cl.⁶ .................................................. H01L 29/00
[52] U.S. Cl. .......................... 257/520; 257/506; 257/508; 257/524
[58] Field of Search ..................................... 257/621, 520, 257/508, 506, 524

[56] References Cited

U.S. PATENT DOCUMENTS 5,306,942  4/1994  Fujii ........................................ 257/508

Primary Examiner—Steven H. Loke
Attorney, Agent, or Firm—Rogers & Killeen

[57] ABSTRACT

A contact region for a trench in a semiconductor device and a method for electrically contacting the conductive material in a trench that is too narrow for conventional electrical contacts may include a contact region in which the trench is divided into two or more trench sections, each section having the same narrow width as the undivided trench. The two or more trench sections are separated by one or more islands that are isolated from the semiconductor device. An aperture through the material above the contact region provides access for electrically contacting the conductive material in the trench sections.

13 Claims, 2 Drawing Sheets

CONTACT REGIONS FOR NARROW TRENCHES IN SEMICONDUCTOR DEVICES AND METHOD

This is a division of application Ser. No. 08/279,027, filed Jul. 22, 1994 now U.S. Pat. No. 5,622,890.

BACKGROUND OF THE INVENTION

The present invention relates to contacts for trenches that may be used in semiconductor devices to isolate portions of the device and to methods of contacting the trenches, and more particularly to contact regions and methods for electrically contacting the conductive material in trenches that are too narrow for conventional electrical contacts.

A semiconductor device may include one or more trenches for isolating portions of the device. As may be seen in FIGS. 1 and 2, a semiconductor device 10 (e.g., a silicon substrate wafer) may include a portion 12 that is to be isolated from other portions 14 by a trench 16 that is filled with a conductive material 18, such as polysilicon. An insulator 20 is typically provided to separate the portions from the conductive material 18. The trench 16 may take any suitable shape, although such trenches typically have near vertical sides, such as illustrated in the figures.

There are various reasons for using trenches filled with a conductive material to separate portions of the device. For example, each of the portions 12 and 14 may be dielectrically isolated and biased at its optimum voltage, while the conductive material 18 in the trench may be biased at a voltage that reduces high-low junction and corner breakdown limitations in the adjacent portions. Other uses for such trenches are known and need not be discussed herein. See, for example, U.S. Pat. Nos. 5,057,895 and 5,196,373 for additional discussion of trenches.

The conductive material 18 in the trench is provided with a contact region so that the appropriate electrical connections can be made. Some semiconductor devices may include an insulative layer 22 overlying the isolated portions 12 and 14 and trenches 16, and appropriate biasing voltage may be provided to the portions and the conductive material through separate contact apertures in the insulative layer 22 (e.g., aperture 24 to the portion 12, and aperture 26 to the conductive material 18). An electrically conductive terminal 28 may be provided that extends through the aperture 26 into contact with the conductive material 18 in the trench.

The selection of an appropriate size and shape for the contact region for the conductive material in the trenches presents problems with conflicting solutions. As is apparent, trenches take up real estate on the surface of the semiconductor device and it is desirable to reduce the size of the trenches to save the real estate for operational components. This may be achieved by reducing their width $W_1$ (their depth and length being difficult to change and determined by the size and arrangement of the isolated portions in the device). The width is determined, at least in part, by the method of forming the trench (such methods being known and need not be discussed herein) and the presence of a contact diffusion area 30 that may provide a width limit for narrow trenches.

Narrow trenches that are uniform in width, or nearly so, are also desirable because the amount of conductive material needed to fill them is less than needed to fill trenches that are not uniformly narrow. Trenches are typically filled by applying a layer of conductive material on top of the semiconductor device, and thereafter removing the conductive material remaining on top of the device, leaving it in the trenches. The width of the widest trench determines the thickness of the conductive material that is to be applied over the entire surface of the semiconductor device. That is, even if a trench includes only a small section that is wider than the rest of the trench, the material used to make the trench must be applied to the thickness needed for the widest section.

However, trenches with narrow widths are very difficult to contact electrically. (Were it not for the desirability of having nearly uniformly narrow trenches, an obvious solution would be to make a portion of the trench wider for an electrical contact region.) The electrical contact to the conductive material in the trench should contact only that material and not adjacent portions of the semiconductor device or the peripheral insulator, and thus it is necessary to make the contact region narrower than the trench. It is also necessary to take into account the manufacturing alignment tolerance encountered during fabrication of the devices (one tolerance on each side of the contact; hereinafter twice the manufacturing alignment tolerance is referred to as the alignment tolerance). Thus, trenches are desirably uniformly narrow to reduce real estate and the cost of manufacturing. On the other hand, the trenches must be able to be electrically contacted. Heretofore, a satisfactory solution to these conflicting goals has not been achieved.

Accordingly, it is an object of the present invention to provide a novel trench contact and method of contacting and making the trenches that obviate the problems of the prior art.

It is another object of the present invention to provide a novel trench contact and method of contacting and making the trenches in which an electrical contact region of sufficient size is provided without increasing the width of the trenches.

It is yet another object of the present invention to provide a novel trench contact and method of contacting and making the trenches in which a narrow trench is divided into two spaced apart trench sections, each section having the same narrow width as the first trench, the combined width of the two trench sections and the space therebetween being sufficient for a contact region.

It is yet a further object of the present invention to provide a novel trench contact and method of contacting and making the trenches in which a trench of predetermined width is provided with a section wider than the predetermined width, the section including at least one island surrounded on its sides by the trench of predetermined width.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
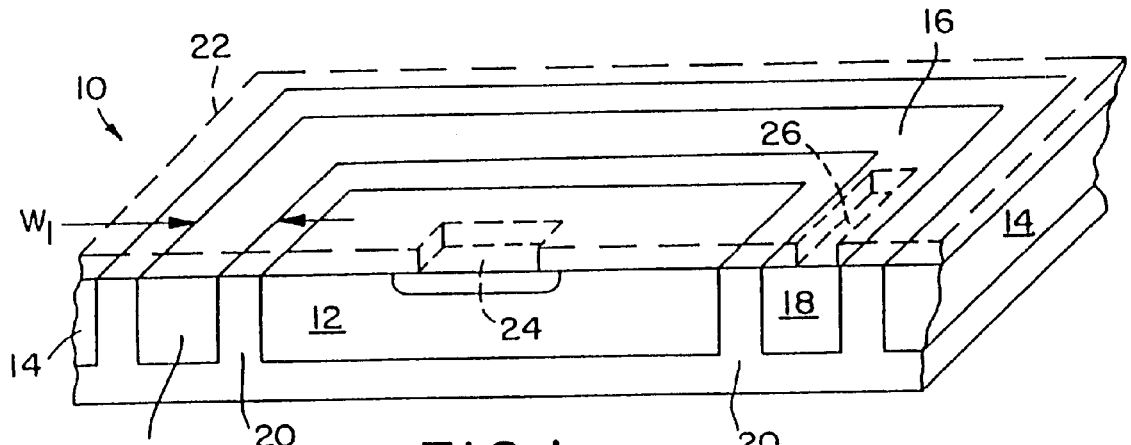
FIG. 1 is a pictorial depiction of a trench of the prior art in a semiconductor device.
Figure 2:
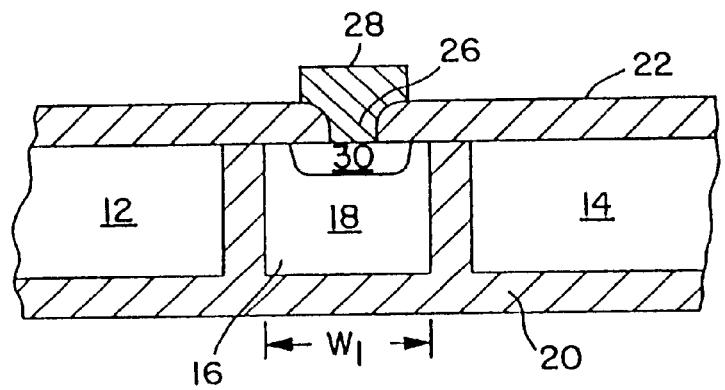
FIG. 2 is a vertical cross section of a portion of a trench of the prior art illustrating a contact region.
Figure 3:
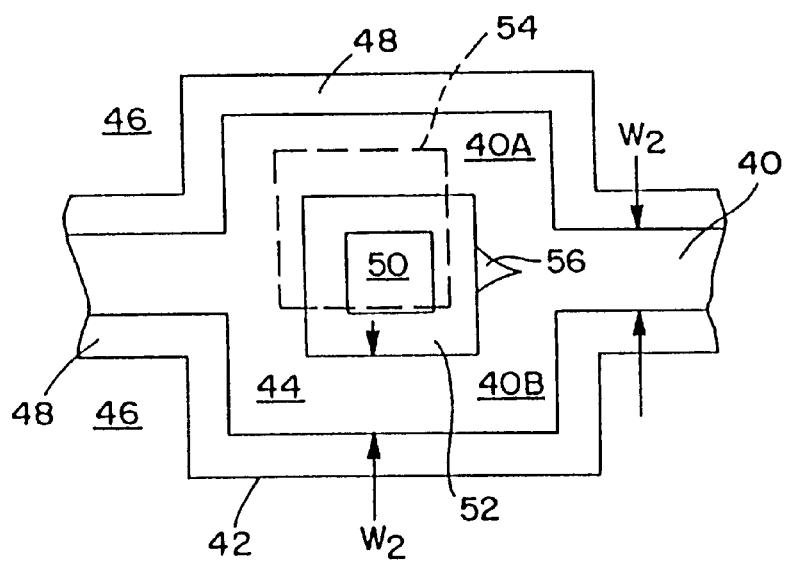
FIG. 3 is a top plan view of an embodiment of the trench contact region of the present invention.

With reference now to FIG. 3 that illustrates a top plan view of an embodiment of the present invention, a trench 40 of width $W_2$ may include a contact region 42 for contacting the conductive material 44 in the trench 40. The trench 40 and contact region 42 may be separated from adjacent portions of the semiconductor device 46 by an insulator 48 that extends under the trench and contact region. In the contact region 42, the trench 40 is divided into two trench sections 40A and 40B, each having the width $W_2$ and each being filled with the conductive material 44. The two trench sections 40A and 40B surround an island 50 that may be formed of any suitable material, desirably the same material used to make other islands, such as silicon. The island 50 may contact the trench sections 40A and 40B, although the island 50 may be isolated from the semiconductor device at its bottom by an insulator (as may be seen in FIG. 5) and from the trench sections 40A and 40B at its sides by an insulator 52. The insulator 52 is not needed structurally or electrically but is a byproduct of the process used to fabricate the device (typically it is formed when the insulator 48 is formed) and an extra step would be needed to remove it.

An aperture 54 (shown in dashed lines) may provide an opening through the material overlying the contact region 42 for allowing electrical contact with the conductive material 44 in the trench sections 40A and 40B. The aperture 54 extends above the contact region (out of the page) so that a terminal (not shown) may be inserted therethrough to contact the conductive material 44. The aperture should expose a portion of the trench sections 40A and/or 40B, and may cover none, part, or all, of the island 50 and insulator 52 (if provided). The island So may be exposed to the terminal in the aperture because the island 50 is preferably isolated from other components in the semiconductor device. Aperture 54 shape and size will vary depending on the shape and size of the contact region provided, or, conversely, may determine the shape and size of the contact region, depending on the design and manufacturing processes used.

The island 50 may take any shape (for example, square, rectangular, ovate, football shaped), with those such as illustrated herein being preferred for ease of manufacture. Projections 56 may be added to islands with flat sides to ensure uniform width of the trenches at the bifurcation, although this is not required.

While the trenches 40A and 40B desirably have a uniform width, they may include small sections that are narrower than the rest of the trenches. Further, trench sections may have differing widths and still benefit from most of the advantages of the invention. For example, the island 50 may not be centered in the contact region 42 (e.a., due to alignment tolerances of the manufacturing process), leaving trenches 40A and 40B with different widths.

Figure 4:
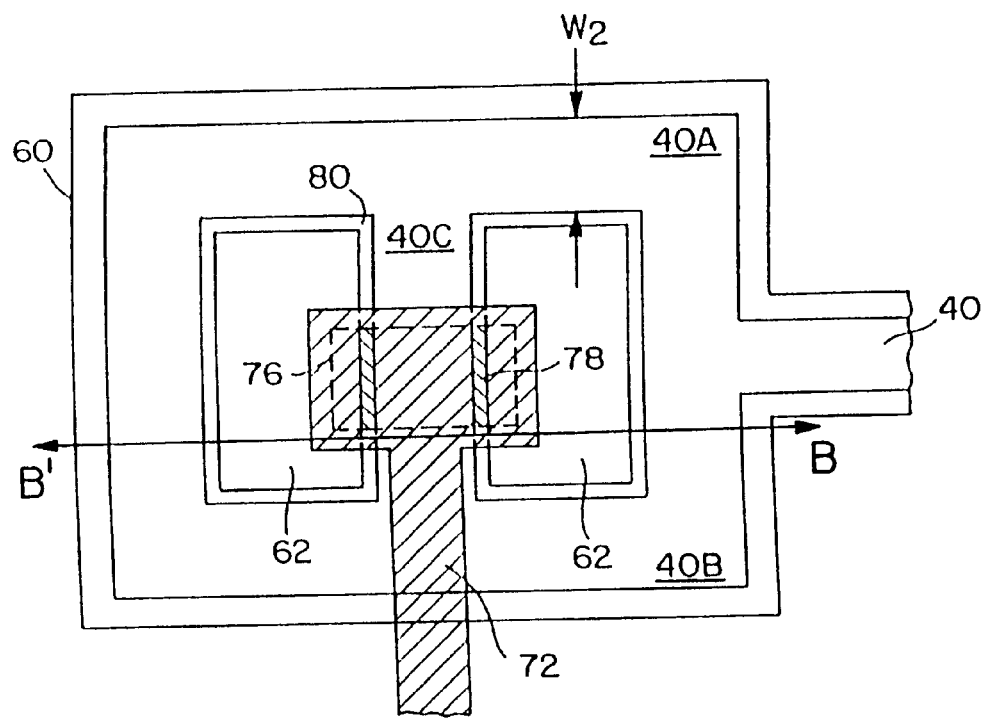
FIG. 4 is a top plan view of another embodiment of the trench contact region of the present invention illustrating plural islands and alternative alignments of the contact aperture.

While the embodiment of FIG. 3 may be adequate for some devices, the embodiment of FIG. 4 may be preferred when the trenches are narrow relative to the alignment tolerances. The aperture 54 of FIG. 3 must expose a portion of the trench so that the conductive material therein may be contacted, and in the event the trench is narrow relative to the alignment tolerances may preclude proper placement of the aperture so that it does not contact the adjacent insulator and semiconductor device.

As may be seen in FIG. 4, an embodiment of the present invention may include two or more islands to increase the options for aperture placement and size, thereby reducing or eliminating alignment tolerance problems. The contact region 60 may include two or more islands 62 that are separated by a trench section 40C that desirably has the same width $W_2$ as the other trench sections 40A and 40B (although some variation in width will not detract substantially from the invention, as discussed above). As is apparent, the number and arrangement of islands may be increased from that shown in FIG. 4 to achieve the desired contact region size and shape, all without increasing trench width.

The contact region may be located on a trench or confluence of several trenches so that the trench sections surrounding the island are connected to the trench at two or more places, such as illustrated in FIG. 3. As illustrated in FIG. 4, the contact region may also be at the end of a trench (if the trench is not continuous) or in a "cul-de-sac" extending from a trench.

The placement of the aperture in the contact region may be improved by positioning the aperture to increase the likelihood that a terminal contact is electrically contacting the conductive material in the trench. This may be achieved by placing the aperture so that it is less likely that the connection to a terminal spans a side insulator for an island.

Figure 5:
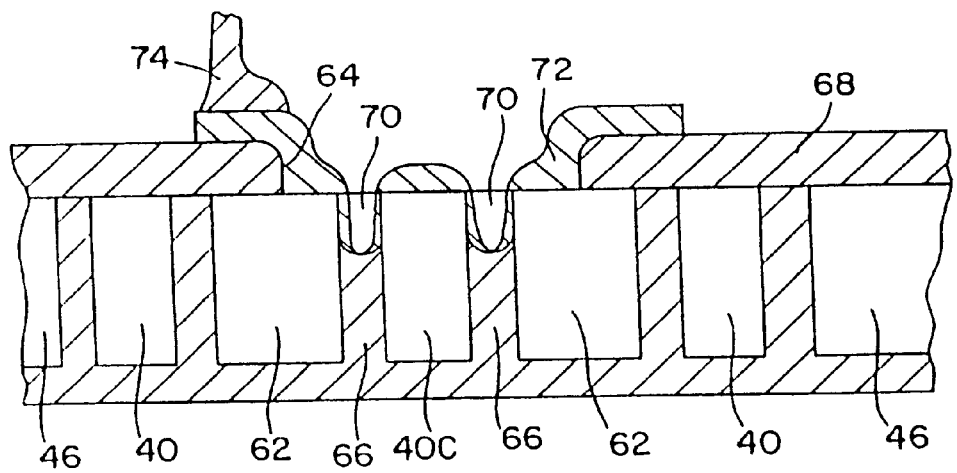
FIG. 5 is a partial vertical cross section of the embodiment of the trench contact region of FIG. 4 along line B'–B illustrating a broken contact terminal.

With reference to FIG. 5, in some fabrication methods the aperture 64 may be formed by etching the insulator 68 on the surface of the semiconductor device (other methods being known in the art). However, the etching process may also erode the side insulation 66 around the islands 62 that is exposed to the etching material and form cavities 70 in the side insulator 66. Note that not all materials and etching processes do this. For example, a silicon nitride side insulator will not be etched by HF acid that may be used to etch an aperture in a silicon dioxide top insulator. When the electrically conductive terminal material 72 is filled into the aperture 64, the cavities 70 in the insulator 66 formed by the etching material may cause gaps in the terminal material 72. Indeed, the gaps may be unavoidable when the aperture 64 is wider than the trench. If a terminal contact 74 is separated from the conductive material in the trench by one of the gaps, the terminal will not make electrical contact with the trench and the device will be inoperative.

A more desirable placement of the aperture in the contact region is where the terminal material 72 cannot be separated from the terminal contact by gaps formed in an etched side insulator. For example, a more desirable position for the aperture is illustrated by aperture 76 in FIG. 4 (outlined in dashed lines.) The etching to form the aperture 76 may erode portions 78 (the double hatched portions) of the oxide 80 leaving gaps when the terminal material 72 is added. However, the terminal material 72 contacts a substantial portion of a trench section providing a suitable electrical connection. While alignment tolerances may cause some of the aperture 76 to overlie a portion of the longitudinal edge of the island 62 and insulator 66, the terminal material is substantially continuous longitudinally and is much more likely to be able to provide space for a suitable electrical contact. Note that a separated portion of the terminal that is relatively small is likely acceptable, provided the terminal material 72 is intact between the conductive material in the trench and the terminal contact. Other aperture alignments may be used depending on the arrangement of islands and trench sections.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A trench contact region in a semiconductor device in which electrical contact is to be made with conductive material in a trench of generally uniform width that separates portions of the semiconductor device, said trench contact region comprising:

an island surrounded on its sides by a first section of trench; and a terminal for electrically contacting the conductive material in said first section of trench without contacting portions of the semiconductor device outside said first section of said trench.

2. The contact region of claim 1 wherein said first section of trench has a width narrower than needed to make electrical contact therewith.

3. The contact region of claim 1 comprising more than one said island.

4. The contact region of claim 3 wherein said first section of trench has a generally uniform width.

5. The contact region of claim 3 wherein said terminal and a portion of said first section separating said islands have longitudinal axes that are generally parallel.

6. The contact region of claim 1 wherein said first section of trench has generally the same width as the remaining portion of said trench.

7. The contact region of claim 1 wherein said island is separated from the conductive material in the trench by an insulator.

8. A trench contact region for contacting a conductive material in a trench in a semiconductor device, the trench separating portions of the semiconductor first device and having a first width that is narrower than needed to electrically contact a conductive material in the trench plus an alignment tolerance, said trench contact region comprising at least two spaced apart trench sections separated by at least one island that is isolated from the semiconductor device, each of said trench sections having a width not substantially more than said first width.

9. The trench contact region of claim 8 further comprising an electrical contact that contacts at least one of said trench sections without contacting the portions of the semiconductor device separated by the trench.

10. The trench contact region of claim 8 wherein said trench sections have said first width.

11. A trench filled with conductive material for separating portions of a semiconductor device, said trench comprising:

a first portion having a first width;

a contact portion having a second width wider than said first width that is connected to said first portion, said contact portion providing access for contacting the conductive material in the trench without contacting the portions of the device separated by said trench, said contact portion comprising an island that is surrounded on its sides by a second portion of said trench that is narrower than needed to electrically contact the conductive material in said second portion.

12. The trench of claim 11 further comprising an insulator separating said island from said second portion of said trench.

13. The trench of claim 11 wherein said second portion of said trench has a uniform width.

* * * * *